United States Patent
Stoss et al.

(10) Patent No.: US 9,822,454 B2
(45) Date of Patent: *Nov. 21, 2017

(54) NUCLEATION LAYER FOR THIN FILM METAL LAYER FORMATION

(75) Inventors: Walter Stoss, Tucson, AZ (US); Clark I. Bright, Tucson, AZ (US)

(73) Assignee: 3M Innovative Properties Company, St. Paul, MN (US)

( * ) Notice: Subject to any disclaimer, the term of this patent is extended or adjusted under 35 U.S.C. 154(b) by 658 days.

This patent is subject to a terminal disclaimer.

(21) Appl. No.: 12/519,983

(22) PCT Filed: Dec. 28, 2007

(86) PCT No.: PCT/US2007/089095
§ 371 (c)(1),
(2), (4) Date: Jun. 18, 2009

(87) PCT Pub. No.: WO2008/083308
PCT Pub. Date: Jul. 10, 2008

(65) Prior Publication Data
US 2010/0089621 A1    Apr. 15, 2010

Related U.S. Application Data

(60) Provisional application No. 60/882,389, filed on Dec. 28, 2006.

(51) Int. Cl.
C23C 28/00    (2006.01)
C23C 14/56    (2006.01)
(Continued)

(52) U.S. Cl.
CPC ........ C23C 28/00 (2013.01); B32B 17/10018 (2013.01); B32B 17/1022 (2013.01);
(Continued)

(58) Field of Classification Search
CPC ....... C23C 28/00; C23C 14/20; C23C 14/562; C23C 14/086; C23C 14/205;
(Continued)

(56) References Cited

U.S. PATENT DOCUMENTS 2,676,117 A    4/1954    Colbert et al.
3,302,002 A    1/1967    Warren
(Continued)

FOREIGN PATENT DOCUMENTS

BE    704 297    10/1967
DE    196 03 746    4/1997
(Continued)

OTHER PUBLICATIONS

Pattabi. Manjunatha and Mohan Rao "Electrical behaviour of discontinuous silver films deposited on softened polyvinylpyridine substrates;" J. Phys. D: appl. Phys. 31 (1998).*
(Continued)

*Primary Examiner* — Kevin R Kruer
(74) *Attorney, Agent, or Firm* — Qiang Han

(57) ABSTRACT

A conductive film is formed on a flexible polymer support by applying a seed layer comprising gallium oxide, indium oxide, magnesium oxide, zinc oxide or mixture (including mixed oxides) thereof to the flexible polymer support, and applying an extensible, visible light-transmissive metal layer over the seed layer. The seed layer oxide desirably promotes deposition of the subsequently-applied metal layer in a more uniform or more dense fashion, or promotes earlier formation (viz., at a thinner applied thickness) of a continuous metal layer. The resulting films have high visible light transmittance and low electrical resistance.

24 Claims, 6 Drawing Sheets

(51) Int. Cl.
| | |
|---|---|
| *B32B 17/10* | (2006.01) |
| *C23C 14/20* | (2006.01) |
| *C23C 14/08* | (2006.01) |
| *G02B 1/111* | (2015.01) |
| *G02B 1/116* | (2015.01) |
| *G02B 5/20* | (2006.01) |
| *C23C 14/02* | (2006.01) |
| *G02B 5/28* | (2006.01) |

(52) U.S. Cl.
CPC ...... *B32B 17/10174* (2013.01); *C23C 14/024* (2013.01); *C23C 14/086* (2013.01); *C23C 14/20* (2013.01); *C23C 14/205* (2013.01); *C23C 14/562* (2013.01); *G02B 1/111* (2013.01); *G02B 1/116* (2013.01); *G02B 5/208* (2013.01); *G02B 5/282* (2013.01); *Y10T 156/10* (2015.01)

(58) Field of Classification Search
CPC .............. Y10T 156/10; B32B 17/1022; B32B 10/10174; B32B 17/10018; G02B 1/111; G02B 1/116; G02B 5/208; G02B 5/282
See application file for complete search history.

(56) References Cited

U.S. PATENT DOCUMENTS

| | | |
|---|---|---|
| 3,311,517 A | 3/1967 | Keslar et al. |
| 3,529,074 A | 5/1968 | Lewis |
| 3,475,307 A | 10/1969 | Knox et al. |
| 3,601,471 A | 8/1971 | Seddon et al. |
| 3,607,365 A | 9/1971 | Lindlof |
| 3,682,528 A | 8/1972 | Apfel et al. |
| 3,720,541 A | 3/1973 | King |
| 3,752,348 A | 8/1973 | Dickason et al. |
| 3,825,917 A | 7/1974 | Lucky |
| 3,897,140 A | 7/1975 | Tuthill |
| 3,990,784 A | 11/1976 | Gelber |
| 4,017,661 A | 4/1977 | Gillery |
| 4,098,965 A | 7/1978 | Kinsman |
| 4,166,876 A | 9/1979 | Chiba et al. |
| 4,226,910 A | 10/1980 | Dahlen et al. |
| 4,234,654 A | 11/1980 | Yatabe et al. |
| 4,283,482 A | 8/1981 | Hattori et al. |
| 4,320,169 A | 3/1982 | Yatabe et al. |
| 4,337,990 A | 7/1982 | Fan et al. |
| 4,413,877 A | 11/1983 | Suzuki et al. |
| 4,463,047 A | 7/1984 | Matteucci et al. |
| 4,537,814 A | 8/1985 | Itoh et al. |
| 4,556,277 A | 12/1985 | Fan et al. |
| 4,565,719 A | 1/1986 | Phillips et al. |
| 4,581,337 A | 4/1986 | Frey et al. |
| 4,590,118 A | 5/1986 | Yatabe et al. |
| 4,600,627 A | 7/1986 | Honda et al. |
| 4,624,867 A | 11/1986 | Iijima et al. |
| 4,639,069 A | 1/1987 | Yatabe et al. |
| 4,645,714 A | 2/1987 | Roche et al. |
| 4,654,067 A | 3/1987 | Ramus et al. |
| 4,695,618 A | 9/1987 | Mowrer |
| 4,696,719 A | 9/1987 | Bischoff |
| 4,699,830 A | 10/1987 | White |
| 4,710,426 A | 12/1987 | Stephens |
| 4,721,349 A | 1/1988 | Fan et al. |
| 4,722,515 A | 2/1988 | Ham |
| 4,782,216 A | 11/1988 | Woodard |
| 4,786,767 A | 11/1988 | Kuhlman |
| 4,786,783 A | 11/1988 | Woodard |
| 4,799,745 A | 1/1989 | Meyer et al. |
| 4,806,220 A | 2/1989 | Finley |
| 4,828,346 A | 5/1989 | Jacobson et al. |
| 4,842,893 A | 6/1989 | Yializis et al. |
| 4,873,139 A | 10/1989 | Kinoskly |
| 4,910,090 A | 3/1990 | Kuhlman et al. |
| 4,952,783 A | 8/1990 | Aufderheide et al. |
| 4,954,371 A | 9/1990 | Yializis |
| 4,959,257 A | 9/1990 | Mukherjee |
| 4,965,408 A | 10/1990 | Chapman et al. |
| 4,973,511 A | 11/1990 | Farmer et al. |
| 4,977,013 A | 12/1990 | Ritchie et al. |
| 5,011,585 A | 4/1991 | Brochot et al. |
| 5,013,416 A | 5/1991 | Murayama et al. |
| 5,018,048 A | 5/1991 | Shaw et al. |
| 5,028,759 A | 7/1991 | Finley |
| 5,032,461 A | 7/1991 | Shaw et al. |
| 5,059,295 A | 10/1991 | Finley |
| 5,062,939 A * | 11/1991 | Roland et al. ................ 427/556 |
| 5,071,206 A | 12/1991 | Hood et al. |
| 5,085,141 A | 2/1992 | Triffaux |
| 5,091,244 A | 2/1992 | Biornard |
| 5,097,800 A | 3/1992 | Shaw et al. |
| 5,104,929 A | 4/1992 | Bilkadi |
| 5,111,329 A | 5/1992 | Gajewski et al. |
| 5,125,138 A | 6/1992 | Shaw et al. |
| 5,237,439 A | 8/1993 | Misono et al. |
| 5,260,095 A | 11/1993 | Affinito |
| 5,270,517 A | 12/1993 | Finley |
| 5,306,547 A | 4/1994 | Hood et al. |
| 5,324,374 A | 6/1994 | Harmand et al. |
| 5,332,888 A | 7/1994 | Tausch et al. |
| 5,354,497 A | 10/1994 | Fukuchi et al. |
| 5,356,947 A | 10/1994 | Ali et al. |
| 5,360,659 A | 11/1994 | Arends et al. |
| 5,377,045 A | 12/1994 | Wolfe et al. |
| 5,395,644 A | 3/1995 | Affinito |
| 5,427,638 A | 6/1995 | Goetz et al. |
| 5,427,861 A | 6/1995 | D'Errico |
| 5,440,446 A | 8/1995 | Shaw et al. |
| 5,454,886 A * | 10/1995 | Burrell et al. ................ 148/565 |
| 5,457,356 A | 10/1995 | Parodos |
| 5,489,489 A | 2/1996 | Swirbel et al. |
| 5,506,037 A | 4/1996 | Termath |
| 5,510,173 A | 4/1996 | Pass et al. |
| 5,521,765 A | 5/1996 | Wolfe |
| 5,529,849 A | 6/1996 | D'Errico |
| 5,536,323 A | 7/1996 | Kirlin et al. |
| 5,540,446 A | 7/1996 | Felsen |
| 5,547,508 A | 8/1996 | Affinito |
| 5,547,908 A | 8/1996 | Furuzawa et al. |
| 5,554,220 A | 9/1996 | Forrest et al. |
| 5,576,101 A | 11/1996 | Saitoh et al. |
| 5,607,789 A | 3/1997 | Treger et al. |
| 5,620,524 A | 4/1997 | Fan et al. |
| 5,629,389 A | 5/1997 | Roitman et al. |
| 5,654,084 A | 8/1997 | Egert |
| 5,681,615 A | 10/1997 | Affinito et al. |
| 5,681,666 A | 10/1997 | Treger et al. |
| 5,684,084 A | 11/1997 | Lewin et al. |
| 5,686,360 A | 11/1997 | Harvey, III et al. |
| 5,693,956 A | 12/1997 | Shi et al. |
| 5,699,188 A | 12/1997 | Gilbert et al. |
| 5,711,816 A | 1/1998 | Kirlin et al. |
| 5,725,909 A | 3/1998 | Shaw et al. |
| 5,731,661 A | 3/1998 | So et al. |
| 5,739,180 A | 4/1998 | Taylor-Smith |
| 5,744,227 A | 4/1998 | Bright et al. |
| 5,747,182 A | 5/1998 | Friend et al. |
| 5,756,192 A | 5/1998 | Crawley et al. |
| 5,757,126 A | 5/1998 | Harvey, III et al. |
| 5,759,329 A | 6/1998 | Krause et al. |
| 5,771,562 A | 6/1998 | Harvey, III et al. |
| 5,773,102 A | 6/1998 | Rehfeld |
| 5,783,049 A | 7/1998 | Bright et al. |
| 5,792,550 A | 8/1998 | Phillips et al. |
| 5,811,177 A | 9/1998 | Shi et al. |
| 5,811,183 A | 9/1998 | Shaw et al. |
| 5,821,692 A | 10/1998 | Rogers et al. |
| 5,844,363 A | 12/1998 | Gu et al. |
| 5,869,761 A | 2/1999 | Nakamura |
| 5,872,355 A | 2/1999 | Hueschen |
| 5,877,895 A | 3/1999 | Shaw et al. |
| 5,891,554 A | 4/1999 | Hosokawa et al. |
| 5,902,641 A | 5/1999 | Affinito et al. |
| 5,902,688 A | 5/1999 | Antoniadis et al. |

(56) References Cited

U.S. PATENT DOCUMENTS

| | | | |
|---|---|---|---|
| 5,904,958 A | 5/1999 | Dick et al. | |
| 5,912,069 A | 6/1999 | Yializis et al. | |
| 5,922,161 A | 7/1999 | Wu et al. | |
| 5,945,174 A | 8/1999 | Shaw et al. | |
| 5,948,552 A | 9/1999 | Antoniadis et al. | |
| 5,965,907 A | 10/1999 | Huang et al. | |
| 5,981,059 A | 11/1999 | Bright et al. | |
| 5,996,498 A | 12/1999 | Lewis | |
| 6,007,901 A | 12/1999 | Maschwitz et al. | |
| 6,030,671 A | 2/2000 | Yang et al. | |
| 6,034,813 A | 3/2000 | Woodward et al. | |
| 6,040,017 A | 3/2000 | Mikhael et al. | |
| 6,040,056 A * | 3/2000 | Anzaki et al. | 428/432 |
| 6,040,939 A | 3/2000 | Demiryont et al. | |
| 6,045,864 A | 4/2000 | Lyons et al. | |
| 6,049,419 A | 4/2000 | Wheatley et al. | |
| 6,066,826 A | 5/2000 | Yializis | |
| 6,083,628 A | 7/2000 | Yializis | |
| 6,092,269 A | 7/2000 | Yializis et al. | |
| 6,104,530 A | 8/2000 | Okamura et al. | |
| 6,106,627 A | 8/2000 | Yializis | |
| 6,107,357 A | 8/2000 | Hawker et al. | |
| 6,111,698 A | 8/2000 | Woodard et al. | |
| 6,118,218 A | 9/2000 | Yializis et al. | |
| 6,132,882 A | 10/2000 | Landin et al. | |
| 6,146,225 A | 11/2000 | Sheats et al. | |
| 6,146,462 A | 11/2000 | Yializis et al. | |
| 6,198,220 B1 | 3/2001 | Jones et al. | |
| 6,204,408 B1 | 3/2001 | Bassler et al. | |
| 6,214,422 B1 | 4/2001 | Yializis | |
| 6,231,939 B1 | 5/2001 | Shaw et al. | |
| 6,243,201 B1 | 6/2001 | Fleming et al. | |
| 6,252,703 B1 | 6/2001 | Nakamura et al. | |
| 6,255,003 B1 | 7/2001 | Woodard et al. | |
| 6,268,695 B1 | 7/2001 | Affinito | |
| 6,316,343 B1 | 11/2001 | Wada et al. | |
| 6,352,761 B1 | 3/2002 | Hebrink et al. | |
| 6,352,777 B1 | 3/2002 | Bulovic et al. | |
| 6,357,880 B2 | 3/2002 | Epstein et al. | |
| 6,368,699 B1 | 4/2002 | Gilbert et al. | |
| 6,376,065 B1 | 4/2002 | Korba et al. | |
| 6,399,228 B1 | 6/2002 | Simpson | |
| 6,413,645 B1 | 7/2002 | Graff et al. | |
| 6,416,872 B1 | 7/2002 | Maschwitz | |
| 6,440,642 B1 | 8/2002 | Shelnut et al. | |
| 6,459,514 B2 | 10/2002 | Gilbert et al. | |
| 6,469,437 B1 | 10/2002 | Parthasarathy et al. | |
| 6,492,026 B1 | 12/2002 | Graff et al. | |
| 6,522,067 B1 | 2/2003 | Graff et al. | |
| 6,541,133 B1 * | 4/2003 | Schicht et al. | 428/697 |
| 6,565,982 B1 | 5/2003 | Ouderkirk et al. | |
| 6,573,652 B1 | 6/2003 | Graff et al. | |
| 6,576,349 B2 * | 6/2003 | Lingle et al. | 428/610 |
| 6,579,423 B2 | 6/2003 | Anzaki et al. | |
| 6,635,989 B1 | 10/2003 | Nilsson et al. | |
| 6,641,900 B2 | 11/2003 | Hebrink et al. | |
| 6,650,478 B1 | 11/2003 | DeBusk et al. | |
| 6,673,438 B1 | 1/2004 | Bond et al. | |
| 6,679,971 B2 | 1/2004 | Tone et al. | |
| 6,737,154 B2 | 5/2004 | Jonza et al. | |
| 6,783,349 B2 | 8/2004 | Neavin et al. | |
| 6,793,796 B2 | 9/2004 | Reid | |
| 6,797,396 B1 | 9/2004 | Liu et al. | |
| 6,808,658 B2 | 10/2004 | Stover | |
| 6,811,867 B1 | 11/2004 | McGurran et al. | |
| 6,818,291 B2 | 11/2004 | Funkenbusch et al. | |
| 6,830,713 B2 | 12/2004 | Hebrink et al. | |
| 6,833,391 B1 | 12/2004 | Chisholm et al. | |
| 6,929,864 B2 | 8/2005 | Fleming et al. | |
| 6,933,051 B2 | 8/2005 | Fleming et al. | |
| 6,946,188 B2 | 9/2005 | Hebrink et al. | |
| 6,965,191 B2 | 11/2005 | Koike et al. | |
| 7,018,713 B2 | 3/2006 | Padiyath et al. | |
| 7,148,360 B2 | 12/2006 | Flynn et al. | |
| 7,150,907 B2 | 12/2006 | Hebrink et al. | |
| 7,169,328 B2 | 1/2007 | Miller et al. | |
| 7,186,465 B2 | 3/2007 | Bright | |
| 7,189,447 B2 | 3/2007 | Conway et al. | |
| 7,215,473 B2 | 5/2007 | Fleming | |
| 7,238,401 B1 | 7/2007 | Dietz | |
| 7,241,506 B2 * | 7/2007 | Hartig | 428/432 |
| 7,261,950 B2 | 8/2007 | Fleming et al. | |
| 7,276,291 B2 | 10/2007 | Bright | |
| 7,351,479 B2 | 4/2008 | Funkenbusch et al. | |
| 7,393,557 B2 | 7/2008 | Fleming et al. | |
| 7,901,781 B2 * | 3/2011 | Maschwitz | B32B 17/10036 428/212 |
| 2001/0010846 A1 | 8/2001 | Hofmeister et al. | |
| 2002/0022156 A1 | 2/2002 | Bright | |
| 2003/0184222 A1 | 10/2003 | Nilsson et al. | |
| 2003/0228476 A1 | 12/2003 | Buhay et al. | |
| 2004/0032658 A1 | 2/2004 | Fleming | |
| 2004/0033369 A1 | 2/2004 | Fleming et al. | |
| 2004/0086717 A1 | 5/2004 | Sasaki et al. | |
| 2004/0241396 A1 | 12/2004 | Jing et al. | |
| 2005/0181123 A1 | 8/2005 | Fleming et al. | |
| 2005/0225234 A1 * | 10/2005 | Tyan et al. | 313/504 |
| 2006/0035073 A1 | 2/2006 | Funkenbusch et al. | |
| 2006/0055308 A1 | 3/2006 | Lairson et al. | |
| 2006/0275613 A1 * | 12/2006 | Butz et al. | 428/432 |
| 2007/0281171 A1 * | 12/2007 | Coster | B32B 17/10036 428/432 |
| 2008/0008893 A1 | 3/2008 | Bright | |
| 2008/0160185 A1 | 7/2008 | Endle et al. | |
| 2009/0109537 A1 | 4/2009 | Bright et al. | |
| 2010/0098621 A1 | 4/2010 | Stoss et al. | |

FOREIGN PATENT DOCUMENTS

| | | |
|---|---|---|
| EP | 0 260 626 | 3/1988 |
| EP | 0 332 717 | 9/1989 |
| EP | 0 340 935 | 11/1989 |
| EP | 0 390 540 | 10/1990 |
| EP | 0 299 753 | 2/1993 |
| EP | 0 547 550 | 6/1993 |
| EP | 0 590 467 | 4/1994 |
| EP | 0 609 088 A2 | 8/1994 |
| EP | 0 691 553 | 1/1996 |
| EP | 0 722 787 | 7/1996 |
| EP | 0 787 826 | 8/1997 |
| EP | 0 810 452 | 12/1997 |
| EP | 0 873 839 | 10/1998 |
| EP | 0 916 394 | 5/1999 |
| EP | 0 931 850 | 7/1999 |
| EP | 0 944 299 | 9/1999 |
| EP | 0 977 167 | 2/2000 |
| EP | 0 977 469 | 2/2000 |
| GB | 1446849 | 8/1976 |
| JP | 57-159645 | 10/1982 |
| JP | 59-70558 | 4/1984 |
| JP | 61-3743 | 1/1986 |
| JP | 61-43555 | 3/1986 |
| JP | 61-79644 | 4/1986 |
| JP | 61-277114 | 12/1986 |
| JP | 62-217506 | 9/1987 |
| JP | 63-136316 | 6/1988 |
| JP | 64-18441 | 1/1989 |
| JP | 2-183230 | 7/1990 |
| JP | 4-369 | 1/1992 |
| JP | 4-48515 | 2/1992 |
| JP | 4-230906 | 8/1992 |
| JP | 6-136159 | 5/1994 |
| JP | 6-251631 | 9/1994 |
| JP | 8-325713 | 12/1996 |
| JP | 9-59763 | 3/1997 |
| JP | 9-291356 | 11/1997 |
| JP | 10-13083 | 1/1998 |
| JP | 10-239697 | 9/1998 |
| JP | 10-275525 | 10/1998 |
| WO | WO 87/07848 | 12/1987 |
| WO | WO90/05439 * | 5/1990 |
| WO | WO 92/10632 A1 | 6/1992 |
| WO | WO 92/12219 | 7/1992 |
| WO | WO 94/18003 A1 | 8/1994 |

(56) References Cited

FOREIGN PATENT DOCUMENTS

| WO | WO 95/10117 | | 4/1995 |
|---|---|---|---|
| WO | WO 97/01440 | | 1/1997 |
| WO | WO 97/01778 | | 1/1997 |
| WO | WO 97/04885 | | 2/1997 |
| WO | WO 97/16053 | | 5/1997 |
| WO | WO 97/22631 | | 6/1997 |
| WO | WO 97/37844 | | 10/1997 |
| WO | WO 98/10116 | | 3/1998 |
| WO | WO 98/18852 | | 5/1998 |
| WO | WO 98/26927 | | 6/1998 |
| WO | WO 99/16557 | | 4/1999 |
| WO | WO 99/16931 | | 4/1999 |
| WO | WO 99/36248 | | 7/1999 |
| WO | WO 99/36262 | | 7/1999 |
| WO | WO 00/26973 | | 5/2000 |
| WO | WO 00/36665 | | 6/2000 |
| WO | WO 00/48749 | | 8/2000 |
| WO | WO 01/31393 | | 5/2001 |
| WO | WO 01/58989 | | 8/2001 |
| WO | WO 01/96104 | | 12/2001 |
| WO | WO 01/96115 A1 | | 12/2001 |
| WO | 03/104519 | * | 12/2003 |
| WO | WO 2008/083304 | | 7/2008 |
| WO | WO 2008/083308 | | 7/2008 |
| WO | WO 2008/112451 | | 9/2008 |
| WO | WO 2011/017039 | | 2/2011 |

OTHER PUBLICATIONS

"Study of Ultra-thin Zinc Oxide Epilayer Growth and UV Detection Properties" Liu, Mingjao (2003) Doctoral Dissertation, University of Pittsburgh (unpublished).*

A.S. da Silva Sobrinho et al., "Transparent Barrier Coatings on Polyethylene Terephthalate by Single-and Dual-Frequency Plasma-Enhanced Chemical Vapor Deposition," *J. Vac. Sci. Technol.*, A 16(6), Nov./Dec. 1998, pp. 3190-3198.

"Phase Imaging: Beyond Topography," Application Notes, date unknown, (2 pages), Jul. 26, 2012 Submitted.

Affinito et al., "A New Method for Fabricating Transparent Barrier Layers," *Thin Solid Films*, (1996), pp. 63-67, vol. 290/291, Elsevier Science S.A.

Affinito et al., "A New Technique for Fabrication of Nonlinear Optical Polymer Thin Films and a Cost Effective Fabrication Method for Nonlinear Optical Waveguides", FY97 Laboratory Directed Research and Development Proposal, (1997), pp. 1-4.

Affinito et al., "Comparison of Surface Treatments of PET and PML", SVC 40th Annual Technical Conference, Paper No. W-05, Proceedings of the Society of Vacuum Coaters, Vacuum Web Coating Session, (1997), (4 pages).

Affinito et al., "Electrochromic Oxides for Wide Area Switchable Camouflage, Windows, and Mirrors", FY97 IR&D Investment Proposal, Material Sciences Department/EMSL, (1997), pp. 1-6.

Affinito et al., "High Rate Vacuum Deposition of Polymer Electrolytes," *J. Vac. Sci. Technol.*, A 14(3), (May/Jun. 1996), pp. 733-738.

Affinito et al., "Low Cost Wide Area Light Emitting Polymer Device Fabrication with PML and LML Process Technology", Battelle Pacific Northwest National Laboratory, (Aug. 1996), pp. 1-19.

Affinito et al., "PML/Oxide/PML Barrier Layer Performance Differences Arising From Use of UV or Electron Beam Polymerization of the PML Layers," *Thin Solid Films*, (1997), pp. 19-25, vol. 308-309, Elsevier Science S.A.

Affinito et al., "Polymer/Polymer, Polymer/Oxide, and Polymer/Metal Vacuum Deposited Interference Filters," Tenth International Vacuum Web Coating Conference, Battelle Pacific Northwest Laboratory, (Nov. 10-12, 1996), pp. 0-14.

Affinito et al., "Polymer-Oxide Transparent Barrier Layers," 39th Annual Technical Conference Proceedings, (1996), pp. 392-397, Society of Vacuum Coaters.

Affinito et al., "Vacuum Deposited Polymer/Metal Multilayer Films for Optical Application," *Thin Solid Films*, vol. 270 (1995), pp. 43-48.

Affinito et al., "Vacuum Deposition of Polymer Electrolytes on Flexible Substrates," Proceedings of the Ninth International Conference on Vacuum Web Coating, (1995), pp. 20-36, ed. R. Bakish, Bakish Press.

Affinito, "Addendum to Attached White Paper on Polymer Multilayer Thin Film Deposition Technology," Mar. 9, 1993, pp. 1-5.

Affinito, "Application of PNL[s] PML Technology to Electrolyte and Advanced Battery Fabrication," Battelle Pacific Northwest Laboratories, Apr. 25, 1994, pp. 1-4.

Affinito, "Battelle Coating Capabilities and Experience," Battelle, Pacific Northwest Laboratories, (1994), (18 pages).

Affinito, "Extremely High Rate Deposition of Polymer Multilayer Optical Thin Film Materials," Battelle Pacific Northwest Laboratory, Jan. 4, 1991, (48 pages).

Affinito, "Li-Polymer Batteries Fabricated with New Materials and New Processing Technology, with Greater than 1200 WHr/I Capacity," Proposal Response to BAA 94-1, Battelle, Pacific Northwest Laboratory, Jan. 1994, pp. 1-21.

Affinito, "Using Lateral Force Microscopy as a Means to Obtain Information about Pinhole Formation in $Al_2O_3$ Barrier Layers Deposited on PET," May 5, 1997, (4 pages).

Affinito, "Vacuum Deposited Polymer/Silver Reflector Material", SPIE, (Jul. 1994), pp. 276-283, vol. 2262, Battelle, Pacific Northwest Laboratory, Materials Sciences Department.

Affinito, et al., "Molecularly Doped Polymer Composite Films for Light Emitting Polymer Applications Fabricated by the PML Process", 41st Annual Technical Conference Proceedings (1998), pp. 220-225, Society of Vacuum Coaters.

Affinito, et al., "Ultrahigh Rate, Wide Area, Plasma Polymerized Films From High Molecular Weight/Low Vapor Pressure Liquid or Solid Monomer Precursors", *J. Vac. Sci. Technol.*, A 17 (4), Jul./Aug. 1999, pp. 1974-1981.

Affinito, et al., "Vacuum Deposited Conductive Polymer Films", The Eleventh International Conference on Vacuum Web Coating, Nov. 9-11, 1997, pp. 201-212.

Affinito, letter to Peter Erickson re: transmittal of literature, May 9, 1997, with an Affinito letter providing an overview of the content of the collection of literature concerning Battelle Pacific Northwest National Laboratory's PML and LML technology for the vacuum deposition of polymer films, May 5, 1997, (4 pages).

Baouchi et al., "Comparison of Non-Reactive and Reactive ITO Sputtering in a High Volume Production Environment", Donnelly Applied Films Corporation, SID 1995 Conference, pp. 89-90.

Barnes et al., "Advanced Materials for Electronic Applications by Polymerization of Cyclic Olefins Using Late Transition Metal Catalysts," (Jun. 10-1, 1998), pp. 1-13.

Blocher, Jr., Chapter 8, "Chemical Vapor Deposition", Deposition Technologies for Films and Coatings, Developments and Applications, (1982), pp. 335-364, Noyes Publications, New Jersey.

Bonifield, Chapter 9, "Plasma Assisted Chemical Vapor Deposition", Deposition Technologies for Films and Coatings, Developments and Applications, (1982), pp. 365-384, Noyes Publications, New Jersey.

Bright et al., "Transparent and Conductive Ultra-Barrier Coatings for Flexible Plastic Display", Delta V Technologies, Inc., American Vacuum Society 46th International Symposium, Seattle, WA, (Oct. 25-29, 1999), (20 pages).

Bright et al., "Transparent Barrier Coatings Based on ITO for Flexible Plastic Displays", (1999), Delta V Technologies, Inc., (18 pages).

Bright, Society of Vacuum Coaters Short Course on "Deposition and Properties of ITO and Other Transparent Conductive Coatings", (1996), Delta V Technologies, Inc., (123 pages).

Cairns et al., "Strain-dependent electrical resistance of tin-doped indium oxide on polymer substrates", *Applied Physics Letters*, vol. 76, No. 11, Mar. 13, 2000, pp. 425-427.

Chahroudi et al., "Transparent Glass Barrier Coating for Flexible Film Packaging", Society of Vacuum Coaters 505/298-7624, 34th Annual Technical Conference Proceedings (1991), pp. 130-133.

(56) References Cited

OTHER PUBLICATIONS

Chatham, "Review Oxygen Diffusion Barrier Properties of Transparent Oxide Coatings on Polymeric Substrates," *Surface & Coatings Technology* (1996), pp. 1-9, vol. 78.
Comer, "The Impact of Visual Anomalies on the Barrier Properties of Metallized Biaxially Oriented Polypropylene Film," (1995), 38th Annual Technical Conference Proceedings, Society of Vacuum Coaters 505/856-7188, pp. 59-60.
Deshpandey et al., "Evaporation Processes", *Thin Film Processes II*, Academic Press, Inc., Chapter II-2, (1991), pp. 79-132.
Gilbert et al., "Comparison of ITO Sputtering Process from Ceramic and Alloy Targets onto Room Temperature PET Substrates," Society of Vacuum Coaters, 36th Annual Technical Conference Proceedings, (1993), pp. 236-241.
Gustafsson et al., "Flexible Light-Emitting Diodes Made From Soluble Conducting Polymers," *Nature*, vol. 357, Jun. 11, 1992, pp. 477-479.
Han et al., "Improved conductivity and mechanism of carrier transport in zinc oxide with embedded silver layer", *Journal of Applied Physics 103*, (2008).
Heil, "Mechanical Properties of PECVD Silicon-Oxide Based Barrier Films on PET," (1995), 38th Annual Technical Conference Proceedings, Society of Vacuum Coaters, 505/856-7188, p. 33.
Hollahan et al., "Plasma Deposition of Inorganic Thin Films," *Thin Film Processes*, Academic Press, Chapter IV-1, (1978), pp. 335-360.
Inoue et al., "Fabrication of a Thin Film of MNA by Vapour Deposition," (1990), pp. 177-179, The 3rd Japan Congress on Materials Research.
Johnson, "The Cathodic Arc Plasma Deposition of Thin Films", *Thin Film Processes II*, Academic Press, Inc., Chapter II-5, (1991), pp. 209-280.
King, "Defrosting of Automobile Windshields Using High Light Transmitting Electro Conducting Films", *Society of Automotive Engineers*, 1974, pp. 1-5.
Knoll et al., "Effects of Process Parameters on PECVD Silicon Oxide and Aluminum Oxide Barrier Films," (1995), 38th Annual Technical Conference Proceedings, Society of Vacuum Coaters 505/856-7188, pp. 425-426 and 430.
Langowski, "Transparent Barrier Coatings for Flexible Packagings: Industrial and Research Activities in Germany," (1996), 39th Annual Technical Conference Proceedings, Society of Vacuum Coaters 505/856-7188, pp. 398 and 415.
Lewis et al., "Highly flexible transparent electrodes for organic light-emitting diode-based displays", *Applied Physics Letters*, vol. 85, No. 16, Oct. 18, 2004, pp. 3450-3452.
Lohwasser et al., "Electron-Beam Oxide Coating on Plastic Films for Packaging, Development, Production and Application," (1995), 38th Annual Technical Conference Proceedings, Society of Vacuum Coater 505/856-7188, pp. 40-41.
Macleod, "Antireflection Coatings", *Thin-Film Optical Filters*, Macmillan Publishing Co., Second Edition, (1986), pp. 71-136.
Mahon et al., "Requirements of Flexible Substrates for Organic Light Emitting Devices in Flat Panel Display Applications", 42nd Annual Technical Conference Proceedings, (1999), pp. 456-459, Society of Vacuum Coaters 505/856-7188.
Mattox, Chapter 6, "Ion Plating Technology", Deposition Technologies for Films and Coatings, Developments and Applications, (1982), pp. 244-287, Noyes Publications, New Jersey.
McGraw-Hill *Multimedia Encyclopedia of Science & Technology*, "Electronic Display," (1998), pp. 1-8.
McGraw-Hill *Multimedia Encyclopedia of Science & Technology*, "Electroluminescence," (1998), pp. 1-3.
McGraw-Hill *Multimedia Encyclopedia of Science & Technology*, "Light-Emitting Diode," (1998), pp. 1-3.
McGraw-Hill *Multimedia Encyclopedia of Science & Technology*, "Liquid Crystals," (1998), pp. 1-5.
McGraw-Hill *Multimedia Encyclopedia of Science & Technology*, "Printed Circuit," (1998), pp. 1-13.
McGraw-Hill *Multimedia Encyclopedia of Science & Technology*, "Sputtering," (1998), pp. 1-3.
Misiano et al., "Inexpensive Transparent Barrier Coatings on Plastic Substrates," (1996), 39th Annual Technical Conference Proceedings, Society of Vacuum Coaters 505/856-7188, pp. 413 and 399.
O'Mara, Liquid Crystal Flat Panel Displays, *Manufacturing Science & Technology*, (1993), Van Nostrand Reinhold Publishing, New York, pp. 21-35, 66-70, 73, 93, 96, 116-117, 123-125, 144-145, 149-150, and 165-175.
Parsons, "Sputter Deposition Processes", *Thin Film Processes II*, Academic Press, Inc., Chapter II-4, (1991), pp. 177-207.
Penning, *Electrical Discharges in Gases*, Gordon and Breach, Science Publishers, (1965), Chapters V-VI, pp. 19-35; and Chapter VIII, pp. 41-50.
Product Information: EMI Shielding Products, Advanced Performance Materials (APM), 2 pages, Jul. 2012.
Product Information: Shielded Windows, Advanced Performance Materials (APM), 1 page, Submitted Jul. 26, 2012.
Product Information: BE 9 Shielded Windows, APM Bavaria GmbH, pp. 60-67, Submitted.
Product Information: Southwall™ Altair™ M Transparent Conductive Film, 1 page, Jul. 26, 2012.
Product Information: Display Products, Southwall Technologies, 2 pages, Submitted Jul. 26, 2012.
Reif, "Plasma-Enhanced Chemical Vapor Deposition", *Thin Film Processes II*, Academic Press, Inc., Chapter IV-1, (1991), pp. 525-564.
Sahu et al., "High quality transparent conductive ZnO/Ag/ZnO multilayer films deposited at room temperature", *Thin Solid Films 515* (2006), pp. 876-879.
Sahu et al., "Study on the electrical and optical properties of Ag/Al-doped ZnO coatings deposited by electron beam evaporation", *Applied Science 253* (2007), pp. 4886-4890.
Shaw et al., "A New High Speed Process for Vapor Depositing Acrylate Thin Films: An Update," Society of Vacuum Coaters 36th Annual Technical Conference (1993), pp. 348-352.
Shaw et al., "A New Vapor Deposition Process for Coating Paper and Polymer Webs," Catalina Coatings, Inc., (1992), pp. 96-102.
Shaw et al., "Use of Evaporated Acrylate Coatings to Smooth the Surface of Polyester and Polypropylene Film Substrates," *Rad Tech* (1996), (12 pages).
Shaw et al., "Use of Vapor Deposited Acrylate Coatings to Improve the Barrier Properties of Metallized Film," Society of Vacuum Coaters 37th Annual Technical Conference (1994), pp. 240-244.
Shi, et al., "In-Situ and Real-Time Monitoring of Plasma-Induced Etching of PET and Acrylic Films", *Plasmas and Polymers*, vol. 4, No. 4, (1999), pp. 247-258.
Shi, et al., "Plasma Treatment of PET and Acrylic Coating Surfaces: I. In-Situ XPS Measurements", *Journal of Adhesion Science and Technology*, vol. 14, No. 12, (2000), pp. 1485-1498.
Technological Information: EMI Theory, Chomerics, 3 pages, Submitted Jul. 26, 2012.
Technological Information: Shielding Methods, Chomerics, 7 pages, Submitted Jul. 26, 2012.
Thornton, Chapter 5, "Coating Deposition by Sputtering", *Deposition Technologies for Films and Coatings, Developments and Applications*, (1982), pp. 170-243, Noyes Publications, New Jersey.
Tropsha et al., "Activated Rate Theory Treatment of Oxygen and Water Transport Through Silicon Oxide/Poly(ethylene terephthalate) Composite Barrier Structures", *J. Phys. Chem. B*, vol. 101, No. 13, (1997), pp. 2259-2266.
Tropsha, et al., "Combinatorial Barrier Effect of the Multilayer $SiO_x$ Coatings on Polymer Substrates", Society of Vacuum Coaters, 40th Annual Technical Conference Proceedings (1997), pp. 64-69.
Vossen et al., "Glow Discharge Sputter Deposition," *Thin Film Processes*, Academic Press, Inc., Chapter 11-1, (1978), pp. 12-73.
Yamada et al., "The Properties of a New Transparent and Colorless Barrier Film," (1995), 38th Annual Technical Conference Proceedings, Society of Vacuum Coaters, pp. 28-29.
Yasuda, "Glow Discharge Polymerization", *Thin Film Processes*, Academic Press, Inc., Chapter IV-2, (1978), pp. 361-398.

\* cited by examiner

NUCLEATION LAYER FOR THIN FILM METAL LAYER FORMATION

CROSS-REFERENCE TO RELATED APPLICATION

This application claims the benefit of the filing date of Provisional Application No. 60/882,389 filed Dec. 28, 2006, the disclosure of which is incorporated herein by reference.

FIELD OF THE INVENTION

This invention relates to electrically conductive films having high visible light transmittance and low electrical resistance. These films are suitable, for example, in electromagnetic interference (EMI) shielding and automotive applications.

BACKGROUND

Optical films are incorporated in a variety of applications. These films sometimes employ a thin layer of a metal such as silver. Optical films are used in various constructions on flexible substrates to obtain beneficial properties. Representative uses for optical films include solar control films, EMI shielding films, window films, and conductive films. These films often require high visible light transmission, and if metalized, low electrical resistivity.

There is a proportional relationship between optical transmission and resistivity in conductive metal layers. This relationship makes the typical objective, forming a film having both high visible light transmission and low resistivity, a delicate balance because changing the performance of either property can adversely affect the other property. When forming a metal layer, the metal can agglomerate as it is deposited. This can result in a film that is non-homogeneous, and can require application of a relatively thick metal layer to provide a highly conductive film or an effective shielding film. This agglomeration or formation of islands makes the optical transmission diminish and causes an increase in resistivity.

There remains a need for flexible optical films having high optical transmission and high electrical conductivity, and a need for methods for preparing such films.

SUMMARY OF THE INVENTION

The present invention provides, in one aspect, a method for forming a conductive film on a flexible polymer support, which method comprises forming a seed layer comprising gallium oxide, indium oxide, magnesium oxide, zinc oxide, tin oxide or mixture (including mixed oxides and doped oxides) thereof atop the flexible polymer support, and applying an extensible, visible light-transmissive metal layer over the seed layer.

In a second aspect, the invention provides a conductive film comprising a flexible polymer support; a seed layer comprising gallium oxide, indium oxide, magnesium oxide, zinc oxide, tin oxide or mixture (including mixed oxides and doped oxides) atop the support; and an extensible, visible light-transmissive metal layer atop the seed layer.

In a third aspect, the invention provides a method for making a glazing article comprising assembling a layer of glazing material and a conductive, visible light-transmissive film. The film has a visible light-transmissive metal layer atop a seed layer comprising gallium oxide, indium oxide, magnesium oxide, zinc oxide or mixture (including mixed oxides and doped oxides) atop a flexible polymer support. The glazing material and film are bonded together into a unitary article.

The disclosed films and articles may provide increased resistance to delamination, fracture or corrosion when formed or when subjected to bending, flexing, stretching, deforming operations or corrosive conditions, while still maintaining adequate electrical conductivity and good EMI shielding performance. In one embodiment, the metal layers are substantially continuous over substantial areas of the film, e.g., over portions of the film where EMI shielding, heating, or like functionality is desired. In some embodiments, the metal layers can be completely continuous over the entire film; and in other embodiments the metal layers can be patterned to define a limited number of apertures, holes, or channels for desired functionality (e.g., to provide one or more frequency selective surfaces or distinct, electrically conductive pathways).

These and other aspects of the invention will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWING

Like reference symbols in the various figures of the drawing indicate like elements. The elements in the drawing are not to scale.

DETAILED DESCRIPTION

Figure 1A:
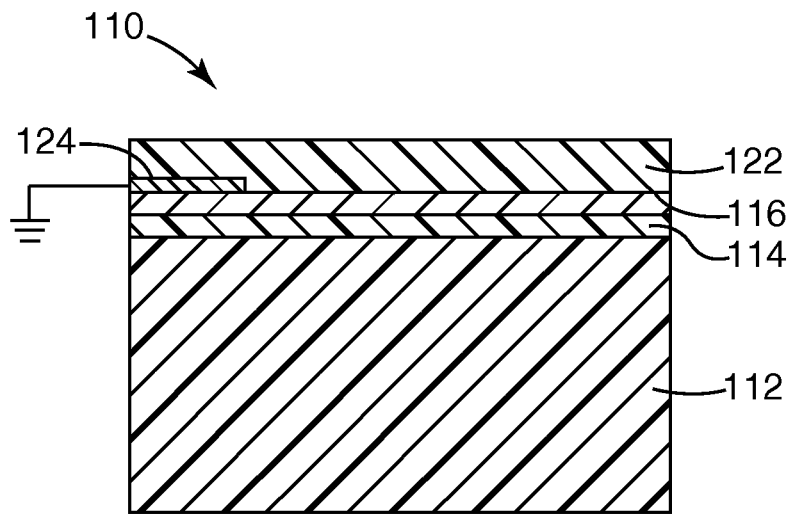
FIGS. 1A-1E are schematic cross-sectional views of exemplary disclosed films.

The words "a", "an", and "the" are used interchangeably with "at least one" to mean one or more of the elements being described. By using words of orientation such as "atop", "on", "uppermost", "underlying" and the like for the location of various elements in the disclosed coated articles, we refer to the relative position of an element with respect to a horizontally-disposed, upwardly-facing support. It is not intended that the films or articles should have any particular orientation in space during or after their manufacture.

The term "compound curvature" when used with respect to a surface or article means the surface or article curves in two different, non-linear directions from a single point.

The term "copolymer" includes both random and block copolymers.

The term "crosslinked" when used with respect to a polymer means the polymer has polymer chains joined together by covalent chemical bonds, usually via crosslinking molecules or groups, to form a network polymer. A crosslinked polymer is generally characterized by insolubility, but may be swellable in the presence of an appropriate solvent.

The term "extensible" when used with respect to a metal layer refers to a layer that when incorporated into a visible light-transmissive film can be stretched by at least about 3% in an in-plane direction without loss of electrical continuity and without forming visible discontinuities in the surface of the metal layer as detected by the naked eye at a distance of about 0.25 meters.

The term "infrared-reflective" when used with respect to a support, layer, film or article means the support, layer, film or article reflects at least about 50% of light in a band at least 100 nm wide in a wavelength region from about 700 nm to about 4,000 nm, measured at a near-normal angle (e.g., at about a 6° angle of incidence).

The term "light" means solar radiation.

The term "metal" includes pure metal and metal alloys.

The term "non-planar" when used with respect to a surface or article (e.g., of glass or other glazing material) means the surface or article has a continuous, intermittent, unidirectional or compound curvature.

The term "optical thickness" when used with respect to a layer means the physical thickness of the layer times its in-plane index of refraction.

The term "optically clear" when used with respect to a film or laminated glazing article means that there is no visibly noticeable distortion, haze or flaws in the film or article as detected by the naked eye at a distance of about 1 meter.

The term "polymer" includes homopolymers and copolymers, as well as homopolymers or copolymers that may be formed in a miscible blend, e.g., by coextrusion or by reaction, including, e.g., transesterification.

The terms "visible light transmittance" or "visible light-transmissive" when used with respect to a support, layer, film or article mean the support, layer, film or article has greater than 50% visible light transmittance at 550 nm.

The term "without substantial cracking or creasing" when used with respect to a film in a laminated glazing article means that there are no visible discontinuities in the film as detected by the naked eye at a distance of about 1 meter, preferably about 0.5 meters.

The term "without substantial wrinkling" when used with respect to a film in a laminated glazing article means that there are no small ridges or furrows resulting from contraction of the smooth film surface as detected using the naked eye at a distance of about 1 meter, preferably about 0.5 meters.

Referring to FIG. 1A, an exemplary film, for use as, e.g., an EMI shield, is shown generally at 110. Film 110 includes flexible support 112 in the form of a visible light-transmissive plastic film (made, for example, from polyethylene terephthalate ("PET")) and a stack of layers atop support 112. The stack includes nucleating oxide seed layer 114 (made, for example, of zinc oxide) atop support 112, extensible metal layer 116 (made, for example, of silver or silver alloy) atop seed layer 114, and protective polymer layer 122 (made, for example, from a crosslinked acrylate) atop layer 116. Protective polymer layer 122 limits damage to the stack and may also alter the optical properties of the stack. Layer 116 may be grounded if desired via optional electrode 124. The seed layer 114, metal layer 116 and protective polymer layer 122 are each visible light-transmissive (as is film 110 as a whole), and preferably at least the metal layer 116 and protective polymer layer 122 are continuous. Seed layer 114 need not be continuous and may be much thinner than layers 116 or 122. For example, seed layer 114 may be a series of small islands which serve as nucleation sites aiding in the deposition of a more uniform or more dense overlying layer 116.

Figure 1B:
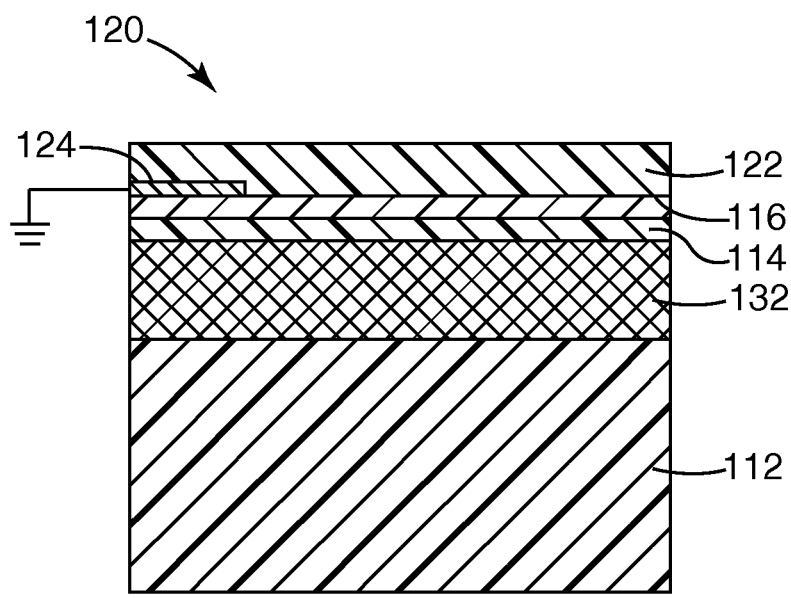

In FIG. 1B, another exemplary film is shown generally at 120. Film 120 resembles film 110, but includes a polymer base coat layer 132 (made, for example, from a crosslinked acrylate) between support 112 and seed layer 114. Base coat layer 132 helps smooth over surface roughness and other defects in support 112, and aids in the eventual deposition of a smoother layer 116. Base coat layer 132 may also alter the optical properties of the stack.

Figure 1C:
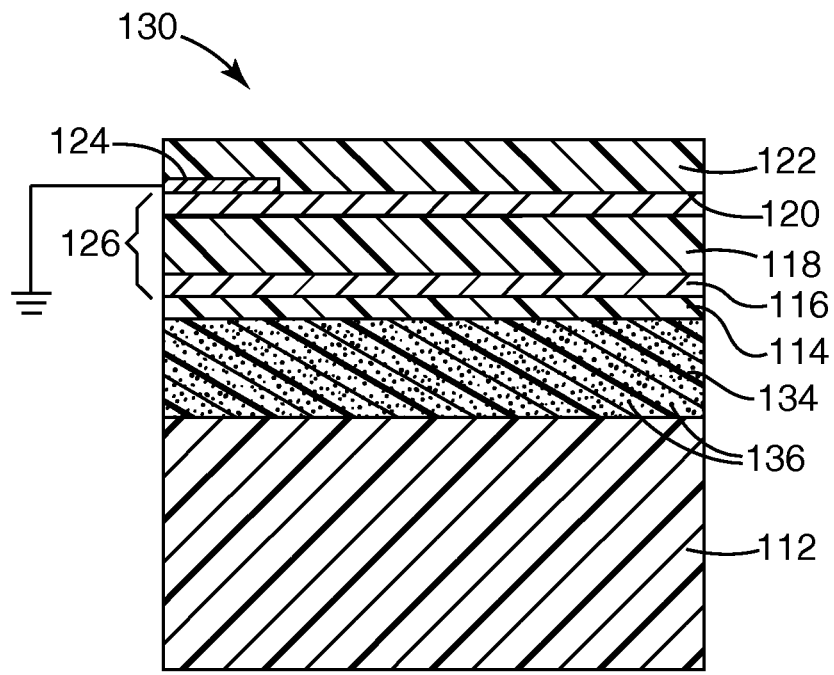

In FIG. 1C, a third exemplary film is shown generally at 130. Film 130 resembles film 110, but includes Fabry-Perot interference stack 126 and hardcoat layer 134 atop support 112. Stack 126 includes first visible light-transmissive metal layer 116, a visible light-transmissive polymer spacing layer 118, and second visible light-transmissive metal layer 120. The thicknesses of layers 116 and 120 and the intervening polymeric spacing layer 118 may be chosen so that layers 116 and 120 are partially reflective and partially transmissive. Spacing layer 118 has an optical thickness that is about ¼ to ½ the wavelength of the center of the desired pass band for transmitted light. Light whose wavelength is within the pass band is mainly transmitted through layers 116 and 120. Light whose wavelength is above or below the pass band is mainly reflected by layers 116 and 120. For example, the thicknesses of the metal layers 116 and 120 and spacing layer 118 may be chosen so that the film is visible light-transmissive and infrared-reflective. Hardcoat 134 has greater hardness (as determined using, for example, a pencil hardness test on the exposed hardcoat) than a polymer base coat such as layer 132 in FIG. 1B. Even though hardcoat 134 is buried beneath stack 126 and protective polymer layer 122, hardcoat 134 surprisingly may impart improved durability to stack 126 (as manifested for example by improved abrasion resistance or pencil hardness tests conducted on article 130) compared to articles having a stack coated on a softer polymer base coat 132 or coated on support 112. Hardcoat layer 134 may also alter the optical properties of the stack. Hardcoat 134 desirably includes filler particles 136 (made, for example, of high refractive index particles such as zinc oxide nanoparticles) which when appropriately selected may provide increased visible light transmission through article 130 compared to an article made without such particles.

Figure 1D:
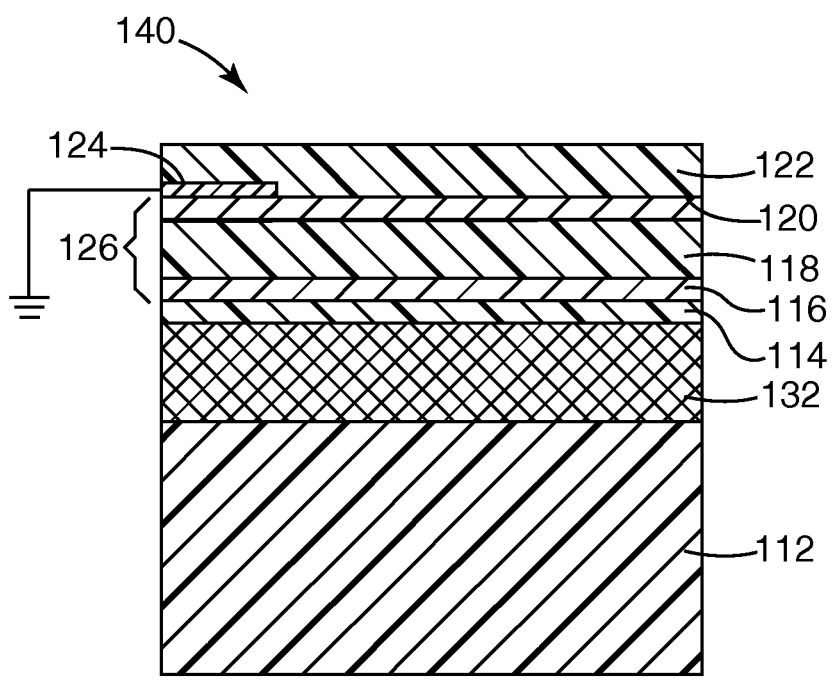

In FIG. 1D, another exemplary film is shown generally at 140. Film 140 resembles film 130, but includes transparent polymer base coat layer 132 in place of hardcoat 134.

Figure 1E:
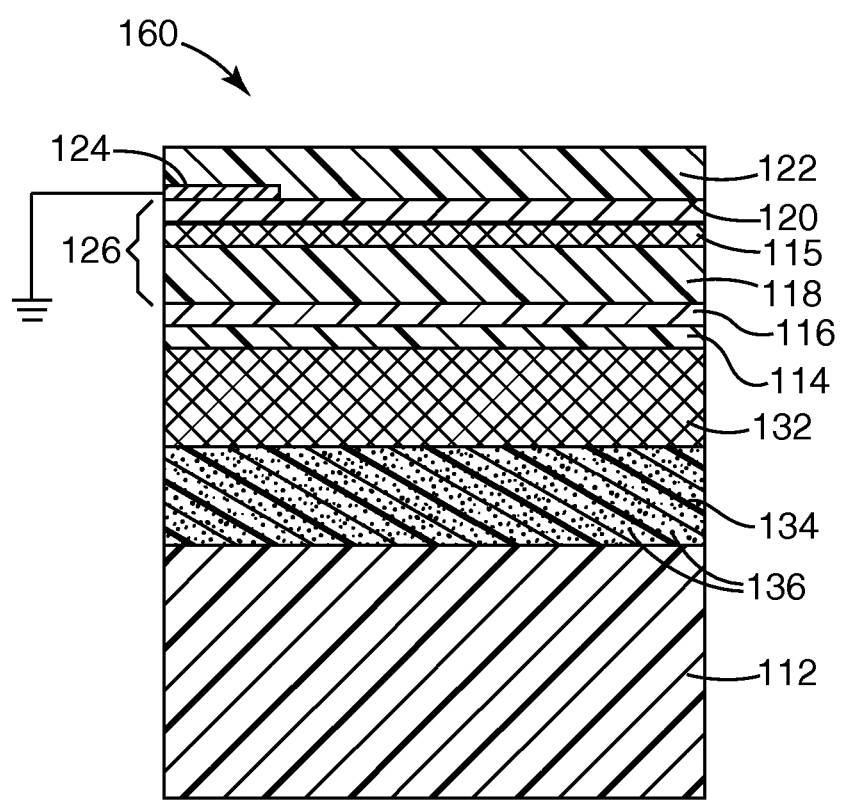

In FIG. 1E, still another exemplary film is shown generally at 160. Film 160 resembles film 140, but includes seed layer 115 (made, for example, of zinc oxide) between polymeric layer 118 and thin metal layer 120, and hardcoat layer 134 beneath polymer base coat layer 132. Either or both of layers 132 and 134 may be omitted, or their order may be reversed.

A variety of visible light-transmissive supports can be employed. In one embodiment, the supports have a visible light transmission of at least about 70% at 550 nm. Exemplary supports include but are not limited to flexible plastic materials including thermoplastic films such as polyesters (e.g., PET or polyethylene naphthalates), polyacrylates (e.g., polymethyl methacrylate), polycarbonates, polypropylenes, high or low density polyethylenes, polysulfones, polyether sulfones, polyurethanes, polyamides, polyvinyl butyral, polyvinyl chloride, polyvinylidene difluoride, polyethylene sulfide and cyclic olefin polymers (e.g., TOPAS™ from Topas Advanced Polymers and ZEONOR™ from Zeon Chemicals, L.P.); and thermoset films such as cellulose derivatives, polyimide, polyimide benzoxazole and polybenzoxazole. The support can be a multilayer optical film ("MOF"), such as those described in U.S. Pat. No. 7,215,473 B2. Supports made of PET and MOF are preferred. The support may have a variety of thicknesses, e.g., a thickness of about 0.01 to about 1 mm. The support may however be considerably thicker, for example, when a self-supporting article is desired. Such self-supporting articles may also be made by forming the disclosed control film on a thin, flexible support and laminating or otherwise joining the flexible support to a thicker, inflexible or less flexible supplemental support such as a glass or plastic panel.

One or more of the smoothness, continuity or adhesion of the applied layers may be enhanced by appropriate pretreatment of the support. In one embodiment, the pretreatment regimen involves electrical discharge pretreatment of the support (e.g., plasma, glow discharge, corona discharge, dielectric barrier discharge or atmospheric pressure discharge) in the presence of a reactive or non-reactive atmosphere (e.g., air, nitrogen, oxygen or an inert gas such as argon), chemical pretreatment or flame pretreatment. These pretreatments may help ensure that the surface of the support or of an overlying layer will be receptive to subsequently applied layers. In another embodiment the support is coated with an organic support coating such as one or both of polymer base coat layer 132 or hardcoat layer 134, optionally followed by further pretreatment using plasma or one of the other pretreatments described above. When employed, an organic base coat layer preferably is based on one or more crosslinked acrylate polymers. If the organic base coat layer is or includes a hardcoat layer, the hardcoat preferably is based on a coating composition containing a dispersion of inorganic oxide particles such as the compositions described in U.S. Pat. No. 5,104,929 (Bilkadi). 3M 906 Abrasion Resistant Coating (from 3M Co.) is a preferred hardcoat composition. The organic base coat layer or layers may be applied using a variety of techniques including solution coating, roll coating (e.g., gravure roll coating) or spray coating (e.g., electrostatic spray coating), then crosslinked using, for example, UV radiation. An organic base coat layer (and desirably also the organic spacing layer and polymeric protective layer) preferably is applied by flash evaporation and vapor deposition of a radiation-crosslinkable monomer or oligomer (e.g., an acrylate monomer or oligomer), followed by crosslinking in situ (using, for example, an electron beam apparatus, UV light source, electrical discharge apparatus or other suitable device), as described in the above-mentioned U.S. Pat. No. 7,215,473 B2 and in U.S. Pat. Nos. 6,818,291 B2, 6,929,864 B2, 7,018,713 B2, and in the documents cited therein. The desired chemical composition and thickness of the organic support coating will depend in part on the nature of the support. For PET and MOF supports the support coating may for example be formed from an acrylate monomer or oligomer and may for example have a thickness sufficient to provide a continuous layer (e.g., a few nm up to about 2 micrometers). The thickness of the base coat layer also may be adjusted to enhance the film optical properties, e.g., to increase transmission through the stack and minimize reflectance by the stack. Adhesion of the nucleating oxide seed layer to the support may be further improved by including an adhesion-promoting or anticorrosion additive in the organic support coating. Suitable adhesion-promoting or anticorrosion additives include mercaptans, acids (such as carboxylic acids or organic phosphoric acids), triazoles, dyes and wetting agents. A specific adhesion-promoting additive, ethylene glycol bis-thioglycolate, is described in U.S. Pat. No. 4,645,714. The additive desirably is present in an amount sufficient to provide increased seed layer adhesion without causing undue oxidation or other degradation of the seed layer.

A variety of oxides may be employed in the nucleating oxide seed layer or layers. Where multiple seed layers are applied they may be the same or different and desirably are the same. The seed layer oxide desirably promotes deposition of the subsequently-applied metal layer in a more uniform or more dense fashion, or promotes earlier formation (viz., at a thinner applied thickness) of a continuous metal layer. Selection of an appropriate oxide may depend upon the chosen support and adjacent metal layer, and normally will be made empirically. Representative seed layer oxides include gallium oxide, indium oxide, magnesium oxide, zinc oxide, tin oxide and mixtures (including mixed oxides and doped oxides) thereof. For example, the seed layer may contain zinc oxide or zinc oxide doped with aluminum or aluminum oxide. The seed layer or layers may be formed using techniques employed in the film metallizing art such as sputtering (e.g., planar or rotary magnetron sputtering); evaporation (e.g., resistive or electron beam evaporation); chemical vapor deposition; metal organic CVD (MOCVD); plasma-enhanced, assisted, or activated CVD (PECVD); ion sputtering; and the like. A seed layer may for example conveniently be formed directly by sputtering the seed layer oxide or in situ by sputtering the precursor metal in an oxidizing atmosphere. The sputtering target may also include metals (e.g., aluminum, indium, tin or zinc) or oxides (e.g., alumina, indium oxide, indium tin oxide, tin oxide or zinc oxide) to make the sputtering target more conductive. Exemplary sputtering targets include zinc oxide:alumina, zinc oxide:gallium oxide, zinc oxide:tin oxide, indium oxide:zinc oxide, indium oxide:tin oxide, indium oxide:tin oxide:zinc oxide, indium:zinc, indium:tin, indium:tin:zinc, indium gallium zinc oxide or $Zn_{(1-x)}Mg_xO$:Al, $MgIn_2O_{(4-x)}$. Specific examples thereof include 99:1 and 98:2 zinc oxide:alumina, 95:5 zinc oxide:gallium oxide, 93:7 zinc oxide:gallium oxide, 90:10 indium oxide:zinc oxide, 90:10 and 95:5 indium oxide:tin oxide, from about 76:24 to about 57:43 indium:zinc and 90:10 indium:tin. Multiple seed layers may have the same or different thicknesses, and preferably are each sufficiently thick so that the subsequently-applied metal layers will be homogeneous with a minimum of light absorption. The seed layer or layers preferably are sufficiently thin so as to ensure that the resultant film and articles employing the film will have the desired degree of visible light transmission. For example, the seed layer or layers may have a physical thickness (as opposed to an optical thickness) less than about 20 nm, less than about 10 nm, less than about 8 nm, less than about 5 nm, less than about 4 nm or less than about 3 nm. The seed layer or layers may also have a physical thickness greater than 0 nm, at least 0.5 nm or at least 1 nm. In one embodiment, the seed layer or layers have a physical thickness greater than 0 and less than about 5 nm. In a second embodiment, the seed layer or layers have physical thicknesses greater than 0 and less than about 4 nm. In a third embodiment, the seed layer or layers have physical thicknesses greater than 0 and less than about 3 nm.

A variety of metals may be employed in the metal layer or layers. When multiple metal layers are employed they may be the same or different and desirably are the same. Exemplary metals include silver, copper, nickel, chrome, noble metals (e.g., gold, platinum or palladium) and alloys thereof. The metal layer can be formed using film metallizing art techniques like those mentioned above for the seed layer, and using a non-oxidizing atmosphere for non-noble metals. The metal layer or layers are sufficiently thick so as to be continuous, and sufficiently thin so as to ensure that the disclosed film and articles employing the film will have the desired degree of visible light transmission. The metal layer normally will be thicker than the underlying seed layer. In one embodiment, the metal layer or layers will have a physical thickness of about 5 to about 50 nm. In another embodiment, the metal layer thicknesses are about 5 to about 15 nm. In a third embodiment, the metal layer thicknesses are about 5 to about 12 nm.

If desired, additional crosslinked polymeric spacing layers such as layer 118 and additional metal layers such as layer 120 can be applied atop the first metal layer. For example, stacks containing 3, 4, 5 or 6 metal layers can provide desirable characteristics for some applications. In a specific embodiment, a film may have a stack containing 2 to 6 metal layers in which each of the metal layers has a crosslinked polymeric spacing layer positioned between the metal layers.

The crosslinked polymeric spacing layer 118 shown in FIGS. 1C-1E lies between the first metal layer 116 and the second metal layer 120 or second nucleating seed layer 115, and may be formed from a variety of organic materials. If desired, the spacing layer can be applied using conventional coating methods such as roll coating (e.g., gravure roll coating) or spray coating (e.g., electrostatic spray coating). The spacing layer preferably is crosslinked using, e.g., techniques like those which may be employed when a crosslinked organic base coat layer is used. A crosslinked organic spacing layer has several advantages over a non-crosslinked organic spacing layer. A crosslinked organic spacing layer will neither melt nor soften as appreciably with heating as a non-crosslinked organic spacing layer, and thus is less likely to flow, deform or thin significantly under the simultaneous influence of temperature and pressure, as during a forming or laminating process. A crosslinked organic spacing layer is highly solvent resistant, whereas a non-crosslinked organic spacing layer may be dissolved or appreciably softened by solvents including those found in automotive fluids such as gasoline, oil, transmission fluid, and window cleaners. A crosslinked organic spacing layer may also have desirable physical properties compared to a non-crosslinked organic spacing layer fabricated from a similar polymer, such as higher modulus and stiffness, better elastic recovery when strained or better resilience. Preferably the spacing layer is crosslinked in situ atop the underlying metal layer. The spacing layer preferably is formed by processes involving flash evaporation, vapor deposition and crosslinking of a monomer or oligomer as described in the above-mentioned U.S. Pat. Nos. 6,818,291 B2, 6,929,864 B2, 7,018,713 B2 and 7,215,473 B2 and in the documents cited therein. Volatilizable (meth)acrylates are preferred for use in such processes, with volatilizable acrylates being especially preferred. Coating efficiency can be improved by cooling the support. Particularly preferred monomers include multifunctional (meth)acrylates, used alone or in combination with other multifunctional or monofunctional (meth)acrylates, such as hexanediol diacrylate, ethoxyethyl acrylate, phenoxyethyl acrylate, cyanoethyl (mono)acrylate, isobornyl acrylate, isobornyl methacrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl (meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, tris(2-hydroxyethyl) isocyanurate triacrylate, pentaerythritol triacrylate, phenylthioethyl acrylate, naphthyloxyethyl acrylate, IRR-214 cyclic diacrylate from UCB Chemicals, epoxy acrylate RDX80095 from Rad-Cure Corporation, and mixtures thereof. A variety of other curable materials can be included in the spacing layer, e.g., acrylamides, vinyl ethers, vinyl naphthalene, acrylonitrile, and mixtures thereof. The spacing layer physical thickness will depend in part upon its refractive index and in part upon the desired optical characteristics of the disclosed film. A preferred optical thickness is about ¼ to ½ the wavelength of the center of the desired pass band for transmitted light. For use in an infrared-rejecting interference stack, the crosslinked organic spacing layer may for example have a refractive index of about 1.3 to about 1.7, an optical thickness of about 75 to about 275 nm (e.g., about 100 to about 150 nm) and a corresponding physical thickness of about 50 to about 210 nm (e.g., about 65 to about 100 nm). Optical modeling can be employed to select suitable layer thicknesses.

The smoothness and continuity of any additional metal layers and their adhesion to an underlying layer (e.g., to a crosslinked polymeric spacing layer) preferably are enhanced by appropriate pretreatment of the underlying layer prior to application of the overlying metal layer, or by inclusion of a suitable additive in the underlying layer. Exemplary pretreatments include the support pretreatments described above, such as plasma pretreatment of the spacing layer.

The uppermost layer of the disclosed films optionally is a suitable protective layer such as layer 122. A variety of organic materials may be used to form the polymeric protective layer. If desired, the protective layer may be applied using conventional coating methods such as roll coating (e.g., gravure roll coating) or spray coating (e.g., electrostatic spray coating). The protective layer preferably is crosslinked using, e.g., techniques like those which may be employed when a crosslinked organic base coat layer is used. The protective layer may also be separately formed and applied using lamination. Preferably the protective layer is formed using flash evaporation, vapor deposition and crosslinking of a monomer or oligomer as described above. Exemplary monomers or oligomers for use in such protective layers include volatilizable (meth)acrylates. The protective layer may also contain adhesion-promoting additives. Exemplary additives include the spacing layer additives described above. If the disclosed film is laminated between sheets of a mechanical energy-absorbing material such as polyvinyl butyral ("PVB"), the index of refraction of the protective layer may be selected to minimize reflection at the interface caused by any difference in refractive indices between the mechanical energy-absorbing material and the disclosed film. The protective layer can also be post-treated to enhance adhesion of the protective layer to the mechanical energy-absorbing material. Exemplary post-treatments include the support pretreatments described above. In one embodiment, plasma post-treatment of both sides of the disclosed films can be employed.

Various functional layers or elements may be added to the disclosed films to alter or improve their physical or chemical properties, particularly at one of the surfaces of the film.

Such layers or coatings can include, for example, low friction coatings or slip particles to make the film easier to handle during the manufacturing process; particles to add diffusion properties to the film or to prevent wet-out or Newton's rings when the film is placed next to another film or surface; adhesives such as pressure sensitive adhesives or hot melt adhesives; primers to promote adhesion to adjacent layers; low adhesion backsize materials for use when the film is to be used in adhesive roll form; and electrodes to permit current flow, voltage sensing or capacitance sensing via one or more of the metal layer or layers. The functional layers or coatings may also include shatter resistant, anti-intrusion, or puncture-tear resistant films and coatings, for example, the functional layers described in published PCT Application No. WO 01/96115 A1. Additional functional layers or coatings may also include vibration-damping or sound-absorbing film layers such as those described in U.S. Pat. Nos. 6,132,882 and 5,773,102, and barrier layers to provide protection or to alter the transmissive properties of the films towards liquids such as water or organic solvents or towards gases such as oxygen, water vapor or carbon dioxide. These functional components can be incorporated into one or more of the outermost layers of the film, or they can be applied as a separate film or coating. For some applications, it may be desirable to alter the appearance or performance of the disclosed film, such as by laminating a dyed film layer to the film, applying a pigmented coating to the surface of the film, or including a dye or pigment in one or more of the materials used to make the film. The dye or pigment can absorb in one or more selected regions of the spectrum, including portions of the infrared, ultraviolet or visible spectrum. The dye or pigment can be used to complement the properties of the disclosed films, particularly where the film transmits some frequencies while reflecting others. A particularly useful pigmented layer that can be employed in the disclosed films is described in U.S. Pat. No. 6,811,867 B1. This layer can be laminated, extrusion coated or coextruded as a skin layer on the films. The pigment loading level can be varied between about 0.01 and about 1.0% by weight to vary the visible light transmission as desired. The addition of a UV absorptive cover layer can also be desirable in order to protect any inner layers of the film that may be unstable when exposed to UV radiation. Other functional layers or coatings which may be added to the disclosed films include, for example, antistatic coatings or films; flame retardants; UV stabilizers; abrasion resistant or hardcoat materials; optical coatings; anti-fogging materials; magnetic or magneto-optic coatings or films; liquid crystal panels; electrochromic or electroluminescent panels; photographic emulsions; prismatic films; and holographic films or images. Additional functional layers or coatings are described, for example, in U.S. Pat. Nos. 6,368,699, 6,352,761 and 6,830,713. The disclosed films may be treated with, for example, inks or other printed indicia such as those used to display product identification, orientation information, advertisements, warnings, decoration, or other information. Various techniques can be used to print on the disclosed films, including screen printing, inkjet printing, thermal transfer printing, letterpress printing, offset printing, flexographic printing, stipple printing, laser printing, and so forth, and various types of ink can be used, including one and two component inks, oxidatively drying and UV-drying inks, dissolved inks, dispersed inks, and 100% ink systems.

When provided with electrodes, the disclosed films may be used for purposes such as antennae, electromagnetic interference (EMI) shielding, and for electrically heated film applications such as de-fogging, de-misting, defrosting or deicing of glazing, vehicular windows and displays. Electrically heated film applications can require substantial current-carrying ability, but must employ a very thin (and accordingly very fragile) metal or metal alloy layer when visible light transparency is required. Electrically heated film applications are disclosed in U.S. Pat. Nos. 3,529,074, 4,782,216, 4,786,783, 5,324,374 and 5,332,888. Electrically heated films are of particular interest in vehicular safety glazing, for example, in the windshield, backlight, sunroof or side windows of an automobile, airplane, train or other vehicle. Metal layers for use at low voltage in such articles desirably have low electrical resistance, e.g., less than or equal to about 20 ohms per square resistance. For example, the metal layers may have from about 5 ohms per square to about 20 ohms per square resistance, from about 7.5 ohms per square to about 15 ohms per square resistance, or from about 7.5 ohms per square to about 10 ohms per square resistance.

The disclosed films and articles including the disclosed films preferably have a transmission in the visible portion of the spectrum (visible light transmittance), $T_{vis}$, of at least about 60%, measured along the normal axis. In another embodiment, the films have at least about 70% visible light transmittance. In still another embodiment, the films have at least about 75% visible light transmittance.

The disclosed films can be joined or laminated to a wide variety of substrates. Typical substrate materials include glazing materials such as glass (which may be insulated, tempered, laminated, annealed, or heat strengthened) and plastics (such as polycarbonates and polymethylmethacrylate). The films may be joined with non-planar substrates, especially those having a compound curvature. The films desirably are extensible and capable of conforming to such non-planar substrates during a lamination and de-airing process without substantial cracking or creasing. The disclosed films can be oriented and optionally heat set under conditions sufficient to assist the film in conforming without substantial wrinkling to a non-planar substrate. This is especially useful when a non-planar substrate to which a film is to be laminated has a known shape or curvature, and especially when the substrate has a known severe compound curvature. By individually controlling the shrinkage of the film in each in-plane direction, the film can be caused to shrink in a controlled fashion during lamination, e.g. during nip roll lamination or autoclaving. For example, if the non-planar substrate to which the film is to be laminated has a compound curvature, then the shrinkage of the film can be tailored in each in-plane direction to match the specific curvature characteristics of the substrate in those directions. The in-plane film direction having the greatest shrinkage can be aligned with the dimension of the substrate having the least curvature, that is, the greatest radius of curvature. In addition to or in place of characterizing curvature according to the radius of curvature, other measurements (such as the depth of a raised or depressed area measured from the geometric surface defined by a major surface of the substrate) can also be used if desired. For lamination to typical non-planar substrates, the film shrinkage can be greater than about 0.4% in both in-plane directions, greater than about 0.7% in at least one in-plane direction, or greater than about 1% in at least one in-plane direction. In one embodiment, the overall film shrinkage is limited to reduce edge delamination or "pull-in." Thus the film shrinkage can be less than about 3% in each in-plane direction, or less than about 2.5% in each in-plane direction. Shrinkage behavior will primarily be governed by factors such as the film or substrate materials employed, and the film stretch ratio(s), heatset temperature, residence time and toe-in (the decrease in rail spacing in a tenter heatset zone measured relative to a maximum rail setting). Coatings can also change film shrinkage properties. For example, a primer coating may reduce the transverse direction ("TD") shrinkage by about 0.2% to about 0.4% and increase the machine direction ("MD") shrinkage by about 0.1 to about 0.3%. Orienting and heat setting equipment can vary widely, and ideal process settings typically are determined experimentally in each case. Further details regarding techniques for manufacturing articles having targeted shrinkage properties are described in U.S. Pat. No. 6,797,396. Further details regarding techniques for manufacturing articles employing MOF supports and for making laminates employing one or two layers of glazing are described in U.S. Pat. No. 7,189,447 B2.

Figure 2:
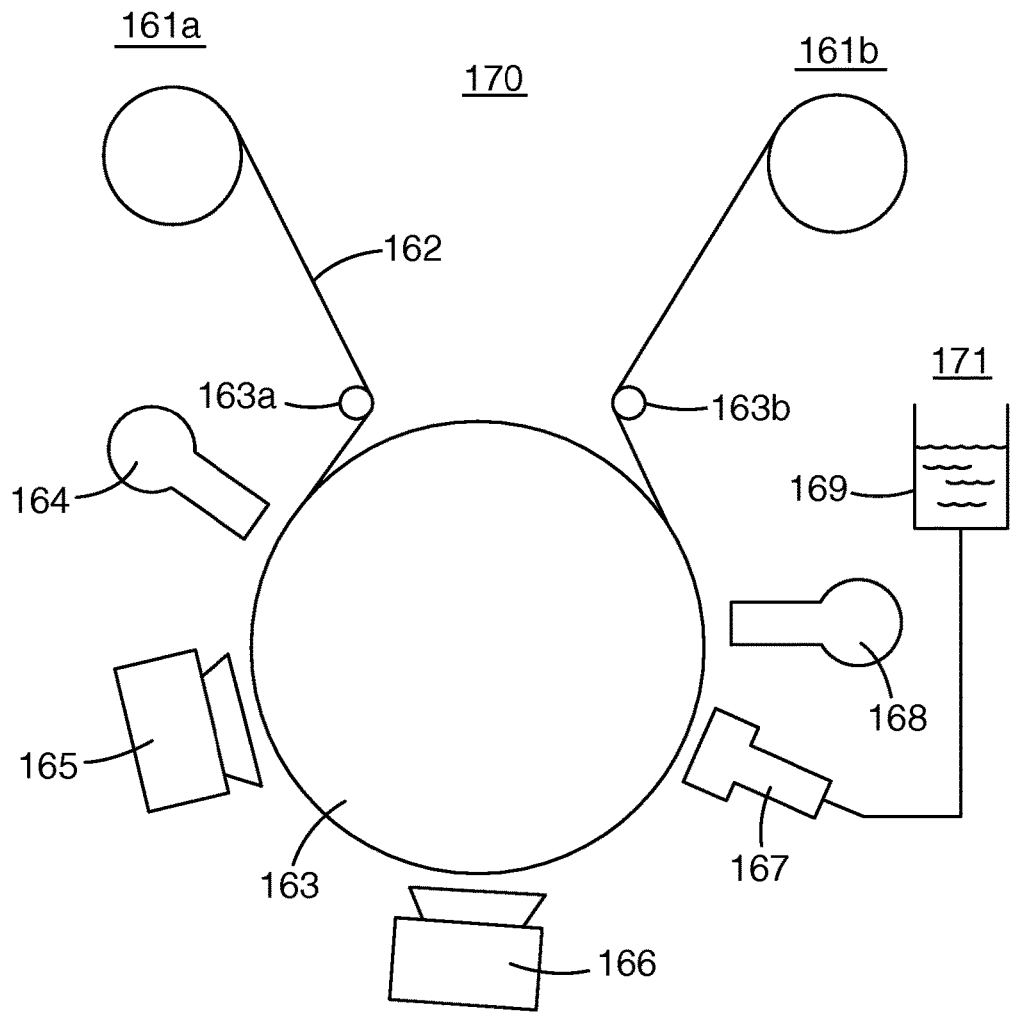
FIG. 2 is a schematic view of an apparatus for preparing films described below.

An example of an apparatus 170 that can conveniently be used to manufacture the films disclosed is shown in FIG. 2. Powered reels 161a and 161b move the support 162 back and forth through apparatus 170. Temperature-controlled rotating drum 163 and idlers 163a and 163b carry the support 162 past plasma pretreater 164, seed metal or seed metal oxide sputtering applicator 165, metal sputtering applicator 166, evaporator 167, and E-beam crosslinking apparatus 168. Liquid monomer or oligomer 169 is supplied to evaporator 167 from reservoir 171. In a first pass through apparatus 170, a first nucleating oxide seed layer such as layer 114, a first metal layer such as layer 116 and if desired an organic spacing layer such as layer 118 may be applied to or formed on support 162. The organic spacing layer may serve as a temporary protective layer that limits damage to the first metal layer while freshly-coated support 162 is rewound from reel 161b back onto reel 161a. A second pass through apparatus 170 may be used to apply or form a second nucleating oxide seed layer such as layer 115, a second metal layer such as layer 120 and a polymeric protective layer such as layer 122. Apparatus 170 can be enclosed in a suitable chamber (not shown in FIG. 2) and maintained under vacuum or supplied with a suitable inert atmosphere in order to discourage oxygen, water vapor, dust and other atmospheric contaminants from interfering with the various pretreatment, coating, crosslinking and sputtering steps. Reactive gases (e.g., oxygen or water vapor) may also be introduced into apparatus 170 (or may outgas from the support or from the chamber itself) to bring about intentional interference, e.g., to convert a metal layer to an oxide layer.

The invention is further illustrated in the following examples, in which all parts, percentages and ratios are by weight unless otherwise indicated.

EXAMPLE 1

A roll of 0.05 mm (2 mil) thick PET substrate was loaded into a roll to roll vacuum chamber like that illustrated in FIG. 2. The substrate was run at a 30.5 m/min (100 ft/min) line speed in the forward direction and coated by reactively magnetron sputtering zinc at 4.0 kW in an atmosphere of 250 sccm of argon and 180 sccm of oxygen, supplied at a pressure of $8.6 \times 10^{-3}$ Torr. Sequentially, in the same pass, the substrate was magnetron sputtered with silver at 8 kW in an atmosphere of 40 sccm of argon, supplied at $2.8 \times 10^{-4}$ Torr. The film was visible-light transmissive and infrared-reflective, and exhibited 77.1% optical transmission at 550 nm. The electrical properties are shown below in Table 1. Conductivity was measured using a DELCOM™ conductance monitor (Delcom Instruments, Inc.), and sheet resistivity was calculated as the reciprocal of the measured conductivity value. The film had a sheet resistivity of 11.5 Ohms/square.

COMPARATIVE EXAMPLE 1

A roll of 0.05 mm thick PET substrate was loaded into the Example 1 vacuum chamber. The substrate was run at a 30.5 m/min line speed in the forward direction and coated with magnetron sputtered silver at 8 kW in an atmosphere of 40 sccm of argon, supplied at $2.8 \times 10^{-4}$ Torr. The resulting film had an optical transmission at 550 nm of 66.2% and a sheet resistivity of 18.7 Ohms/square. This film, made without a seed layer, had both lower visible light transmission and lower electrical conductivity than the Example 1 film.

COMPARATIVE EXAMPLE 2

A roll of 0.05 mm thick PET substrate was loaded into the Example 1 vacuum chamber. The substrate was run at a 33.5 m/min (110 ft/min) line speed in the forward direction and coated with magnetron sputtered titanium at 2.8 kW in an atmosphere of 10 sccm of argon, supplied at a pressure of $8.1 \times 10^{-4}$ Torr. Due to the high gettering tendencies of metallic titanium, the seed layer was assumed to form titanium oxide via reaction with incidental oxygen in the chamber or contributed by the support. Sequentially, in the same pass, the substrate was magnetron sputtered with silver at 8 kW in an atmosphere of 140 sccm of argon, supplied at $1.2 \times 10^{-3}$ Torr. The film exhibited 64.9% optical transmission at 550 nm. The sheet resistivity was 10.5 Ohms/square. This film, made using a titanium sputtering target rather than a zinc target, had lower visible light transmission than both the Example 1 and Comparative Example 1 films.

TABLE 1

| | Film Properties | | | | |
|---|---|---|---|---|---|
| Example | % T at 550 nm | Sputtering Voltage (V) | Sputtering Current (I) | Conductivity | Sheet Resistivity (Ohms/sq) |
| 1 | 77.1 | 712 | 11.4 | 0.0867 | 11.5 |
| Comp. 1 | 66.2 | 672 | 12.1 | 0.0536 | 18.7 |
| Comp. 2 | 64.9 | 611 | 12.9 | 0.0957 | 10.4 |

Figure 3:
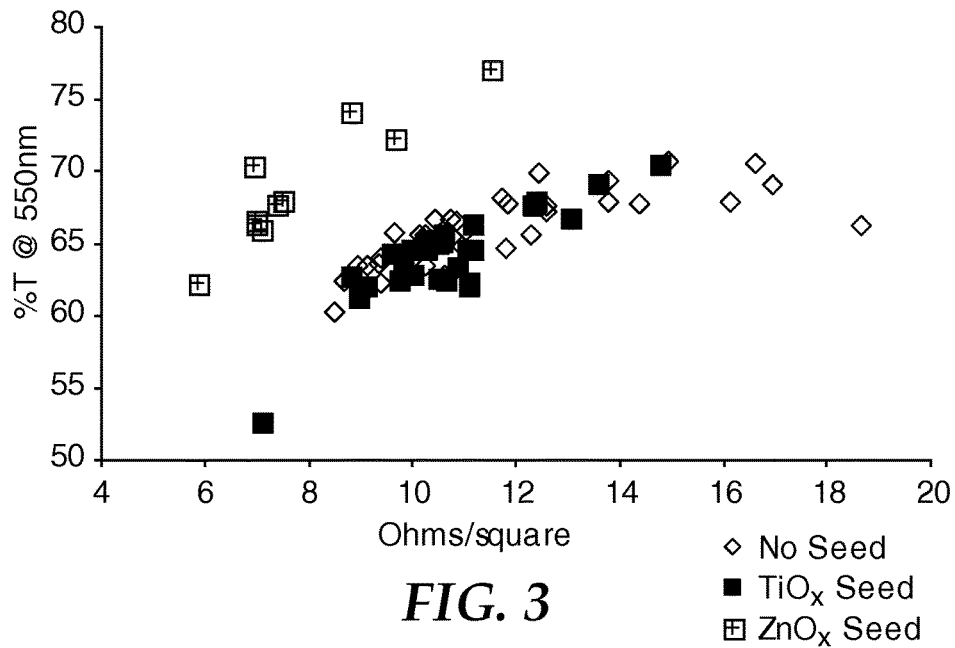
FIG. 3 is a graphic representation of the transmission of light and the surface resistivity of thin silver layer films deposited without a seed layer or atop titanium oxide or zinc oxide seed layers.

FIG. 3 compares transmission at 550 nm to sheet resistivity for a series of samples made as described above. Samples made like the Example 1 film are shown using an unfilled rectangular box with a superimposed cross. Samples made like the Comparative Example 1 film are shown using an unfilled diamond symbol. Samples made like the Comparative Example 2 film are shown using a filled (viz., darkened) rectangular box. FIG. 3 shows that the samples made according to Example 1 taken as a whole have improved transmission and conductivity compared to the other samples

EXAMPLE 3

Figure 4:
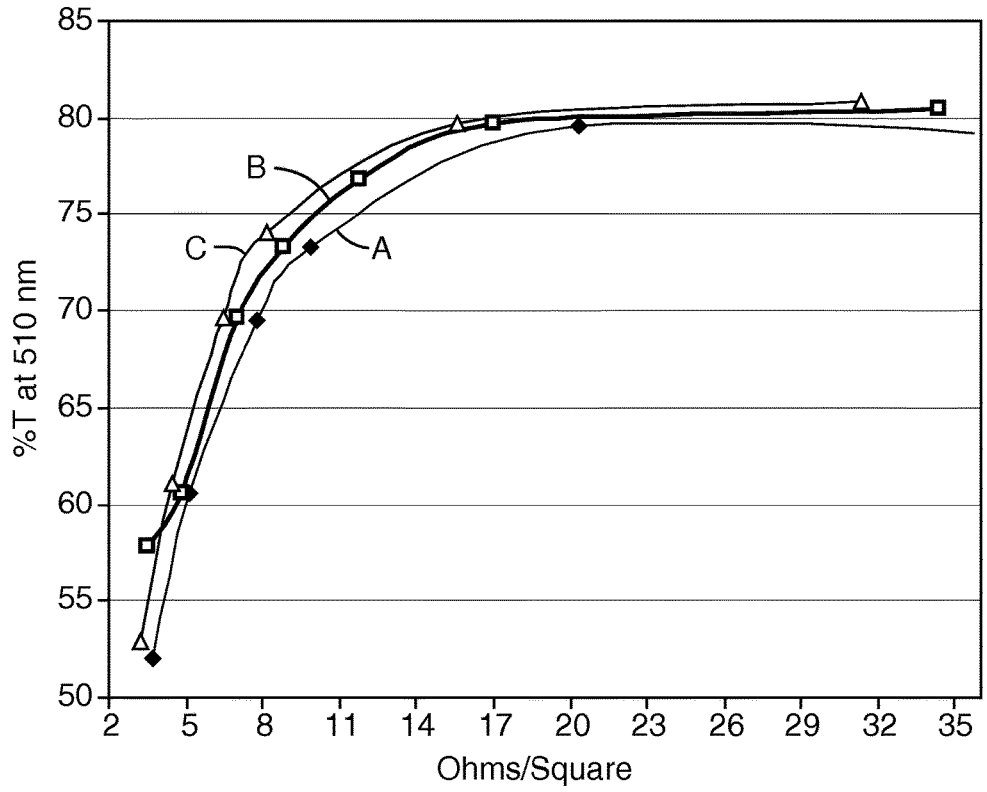
FIG. 4 is a graph illustrating transmittance embodiments prepared using a zinc oxide seed layer and silver metal layer at various sputtering power levels.

Using the method of Example 1 but with an 18.3 m/min (60 ft/min) line speed and a 98:2 zinc oxide:alumina seed layer sputtering target, a PET substrate was magnetron sputtered with a zinc oxide:alumina nucleating seed layer at 1, 4 and 8 kW, then magnetron sputtered with silver at 2, 3, 4, 5, 6, 8 and 10 kW. The optical properties of the resulting films are shown in FIG. 4, with the curves A, B and C respectively corresponding to the 1, 4 and 8 kW seed layer power levels, and the points along each individual curve corresponding to increasing silver power levels. Higher silver power levels (and for many runs, higher seed power levels) corresponded to lower transmission levels.

EXAMPLE 4

Figure 5:
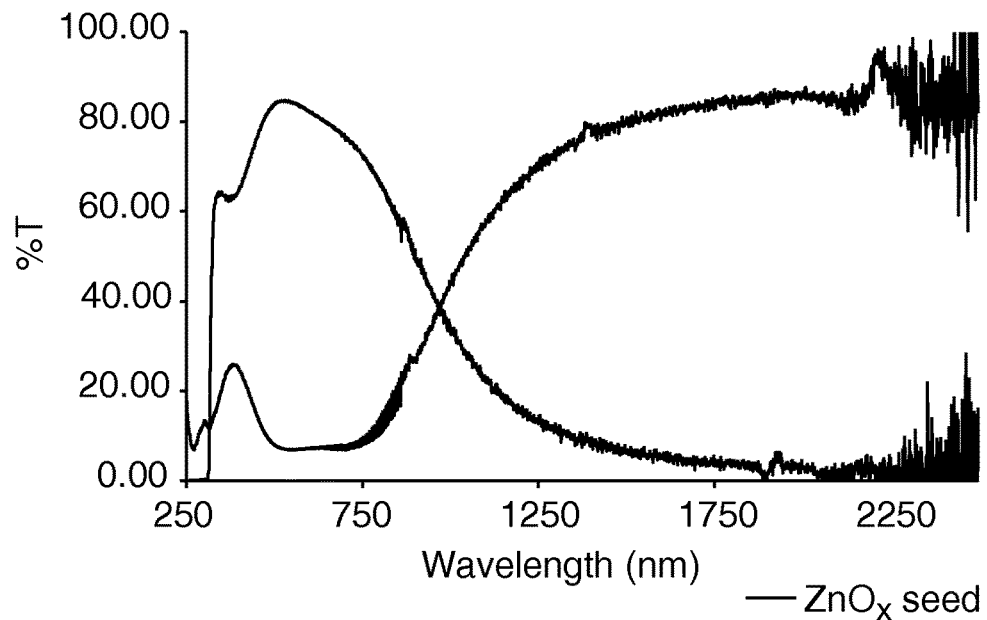
FIG. 5 is a graph illustrating transmittance and reflection for embodiments prepared using a zinc oxide seed layer.
Figure 6:
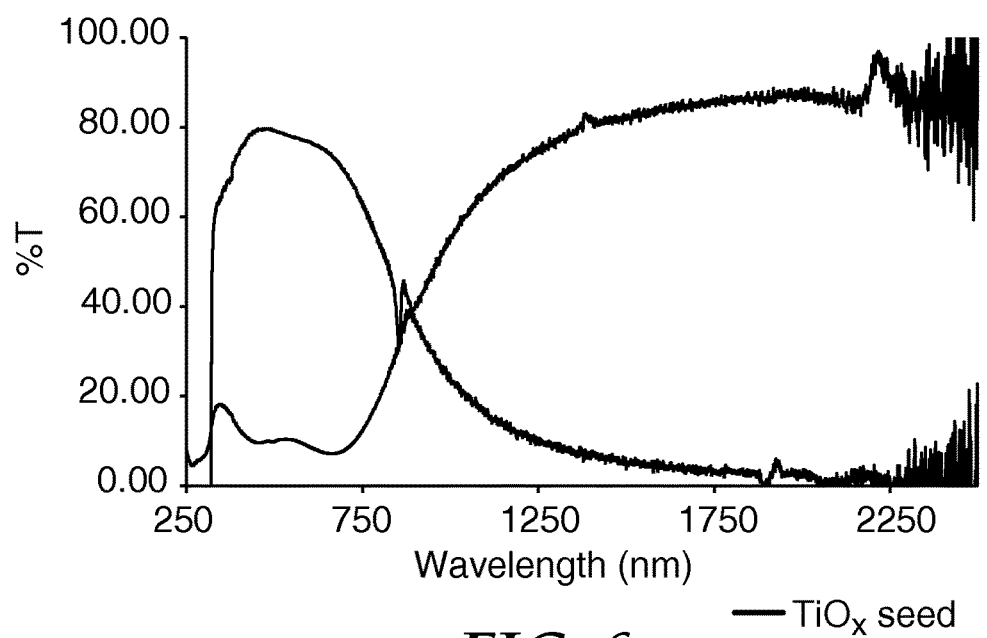
FIG. 6 is a graph illustrating transmittance and reflection for a comparative film prepared using a titanium oxide seed layer.

A PET support was coated with an optical stack containing in order a crosslinked acrylate base coat layer, a first zinc oxide nucleating seed layer, a first silver metal layer, a crosslinked acrylate spacing layer, a second zinc oxide nucleating seed layer, a second silver metal layer and a crosslinked acrylate protective layer in an acrylate/ZnO/Ag/acrylate/ZnO/Ag/acrylate stack configuration. The crosslinked acrylate layers were all made using a mixture of 64% IRR214 acrylate (UCB Chemicals), 28% n-lauryl acrylate and 8% ethylene glycol bis-thioglycolate and applied using the general method of U.S. Pat. No. 6,818,291 B2. The zinc oxide and silver layers were applied using the general method of Example 1. A transmission/reflection curve for the resulting film is shown in FIG. 5. In a comparative run, a similar film was prepared using a titanium oxide seed layer applied using the general method of Comparative Example 2. A transmission/reflection curve for the resulting film is shown in FIG. 6. As can be seen by comparing FIG. 5 and FIG. 6, the FIG. 5 optical stack exhibited generally better optical properties than the FIG. 6 optical stack.

All references cited herein are expressly incorporated herein by reference in their entirety into this disclosure. Illustrative embodiments of this disclosure are discussed and reference has been made to possible variations within the scope of this disclosure. These and other variations and modifications in the disclosure will be apparent to those skilled in the art without departing from the scope of the disclosure, and it should be understood that this disclosure and the claims shown below are not limited to the illustrative embodiments set forth herein.

We claim:

1. A conductive film comprising a flexible polymer support; a discontinuous seed layer as a series of islands having a physical thickness less than 3 nanometers and comprising a mixture selected from two or more of gallium oxide, indium oxide, magnesium oxide, zinc oxide, and tin oxide on the support; and a visible light-transmissive metal layer atop the seed layer.

2. The film of claim 1, further comprising an organic support coating between the support and the seed layer.

3. The film of claim 1, wherein the seed layer comprises indium oxide:zinc oxide, indium oxide:tin oxide, or indium gallium zinc oxide.

4. The film of claim 1, wherein the metal layer physical thickness is about 5 to about 50 nm.

5. The film of claim 1, wherein the film has at least about 70% visible light transmittance and less than about 20 ohms per square sheet resistivity.

6. The film of claim 1, wherein the film has from about 7.5 to about 15 ohms per square sheet resistivity.

7. The film of claim 1, wherein the seed layer comprises zinc oxide.

8. The film of claim 7, wherein the zinc oxide is doped with aluminum or aluminum oxide.

9. The film of claim 1, further comprising a second discontinuous seed layer as a series of islands atop the metal layer and a second metal layer atop the second discontinuous seed layer.

10. The film of claim 9, wherein the metal layers are separated by a polymeric spacing layer and provide an infrared-rejecting Fabry-Perot stack.

11. The film of claim 9, further comprising third, fourth, fifth or sixth discontinuous seed layers as a series of islands and third, fourth, fifth or sixth metal layers atop the second metal layer, wherein the metal layers are separated by polymeric spacing layers and provide an infrared-rejecting Fabry-Perot stack.

12. An electrical device comprising the film of claim 1.

13. A method for forming a conductive film on a flexible polymer support, which method comprises:
  a) forming on the flexible polymer support or on an organic support coating on the flexible polymer support, a discontinuous seed layer formed as a series of islands having a physical thickness less than 3 nanometers and comprising a mixture selected from two or more of gallium oxide, indium oxide, magnesium oxide, zinc oxide, and tin oxide; and
  b) depositing a visible light-transmissive metal layer over the seed layer.

14. The method of claim 13, wherein the seed layer comprises zinc oxide.

15. The method of claim 13, wherein the seed layer is formed using a sputtering target comprising zinc oxide:alumina, indium oxide:zinc oxide, indium oxide:tin oxide, indium oxide:tin oxide:zinc oxide, indium:zinc, indium:tin, or indium gallium zinc oxide.

16. The method of claim 13, wherein the metal layer comprises silver.

17. The method of claim 13, wherein the metal layer physical thickness is about 5 to about 50 nm.

18. The method of claim 13, wherein the film has at least about 70% visible light transmittance and less than about 20 ohms per square sheet resistivity.

19. The method of claim 13, further comprising:
  c) forming a second discontinuous seed layer as a series of islands comprising gallium oxide, indium oxide, magnesium oxide, zinc oxide, tin oxide or mixtures including mixed oxides or doped oxides thereof over the metal layer; and
  d) depositing a second visible light-transmissive metal layer over the second seed layer.

20. The method of claim 19, further comprising forming a polymeric spacing layer between the metal layers to provide an infrared-rejecting Fabry-Perot stack.

21. A method for making a glazing article, which method comprises:
  a) assembling a layer of glazing material and a film comprising:
    a flexible polymer support;
    a discontinuous seed layer on the flexible polymer support or on an organic support coating on the flexible polymer support, formed as a series of islands having a physical thickness less than 3 nanometers and comprising a mixture selected from two or more of gallium oxide, indium oxide, magnesium oxide, zinc oxide, and tin oxide; and
    a visible light-transmissive metal layer atop the discontinuous seed layer; and
  b) bonding the glazing material and film together into a unitary article.

22. The method of claim 21, wherein the glazing material comprises glass and the glazing article further comprises an energy-absorbing layer between the film and the glass.

23. The method of claim 21, wherein the seed layer comprises indium oxide:zinc oxide, indium oxide:tin oxide, or indium gallium zinc oxide.

24. The method of claim 21, further comprising at least a second discontinuous seed layer as a series of islands atop the metal layer and at least a second metal layer atop the second discontinuous seed layer, wherein the metal layers are separated by a polymeric spacing layer and provide an infrared-rejecting Fabry-Perot stack, and the metal layer physical thicknesses are about 5 to about 50 nm.

* * * * *

UNITED STATES PATENT AND TRADEMARK OFFICE
CERTIFICATE OF CORRECTION

| | |
|---|---|
| PATENT NO. | : 9,822,454 B2 |
| APPLICATION NO. | : 12/519983 |
| DATED | : November 21, 2017 |
| INVENTOR(S) | : Wally Stoss |

It is certified that error appears in the above-identified patent and that said Letters Patent is hereby corrected as shown below:

<u>Page 5, Column 1 (Other Publications)</u>
Line 27, Delete "$3^{rd}$" and insert --$33^{rd}$--, therefor.

Signed and Sealed this
Nineteenth Day of June, 2018

Andrei Iancu
*Director of the United States Patent and Trademark Office*